United States Patent
Heo et al.

(10) Patent No.: US 10,096,735 B2
(45) Date of Patent: *Oct. 9, 2018

(54) PHOTODETECTOR USING BANDGAP-ENGINEERED 2D MATERIALS AND METHOD OF MANUFACTURING THE SAME

(71) Applicant: Samsung Electronics Co., Ltd., Suwon-si, Gyeonggi-do (KR)

(72) Inventors: Jinseong Heo, Seoul (KR); Seongjun Park, Seoul (KR); Kiyoung Lee, Seoul (KR); Sangyeob Lee, Hwaseong-si (KR); Eunkyu Lee, Yongin-si (KR); Jaeho Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/668,997

(22) Filed: Aug. 4, 2017

(65) Prior Publication Data

US 2017/0338260 A1   Nov. 23, 2017

Related U.S. Application Data

(63) Continuation-in-part of application No. 15/085,100, filed on Mar. 30, 2016, now Pat. No. 9,806,218.

(30) Foreign Application Priority Data

Oct. 21, 2015   (KR) .................. 10-2015-0146663

(51) Int. Cl.
*H01L 31/107* (2006.01)
*H01L 31/105* (2006.01)
*H01L 31/18* (2006.01)
*H01L 31/0232* (2014.01)
*H01L 31/0336* (2006.01)
(Continued)

(52) U.S. Cl.
CPC ........ *H01L 31/1075* (2013.01); *H01L 29/267* (2013.01); *H01L 29/6603* (2013.01);
(Continued)

(58) Field of Classification Search
CPC ............... H01L 29/1606; H01L 29/267; H01L 29/66015; H01L 29/6603; H01L 31/02327;
(Continued)

(56) References Cited

U.S. PATENT DOCUMENTS 8,735,895 B2   5/2014   Kim et al.
9,379,271 B2   6/2016   Shen et al.
(Continued)

FOREIGN PATENT DOCUMENTS

JP   H1041538 A   2/1998
JP   4963120 B2   6/2012
KR   2014/0091812 A   7/2014

OTHER PUBLICATIONS

Koppens, et al. "Photodetectors based on graphene, other two-dimensional materials and hybrid systems", Nature Nanotechnology vol. 9, pp. 780-793 (2014).
(Continued)

*Primary Examiner* — Stephen W Smoot
(74) *Attorney, Agent, or Firm* — Harness, Dickey & Pierce, P.L.C.

(57) ABSTRACT

A photodetector includes an insulating layer on a substrate, a first graphene layer on the insulating layer, a 2-dimensional (2D) material layer on the first graphene layer, a second graphene layer on the 2D material layer, a first electrode on the first graphene layer, and a second electrode on the second graphene layer. The 2D material layer includes a barrier layer and a light absorption layer. The barrier layer has a larger bandgap than the light absorption layer.

16 Claims, 15 Drawing Sheets

(51) Int. Cl.
  H01L 29/66    (2006.01)
  H01L 29/267   (2006.01)
  H01L 31/109   (2006.01)
  H01L 29/16    (2006.01)

(52) U.S. Cl.
  CPC .. H01L 29/66015 (2013.01); H01L 31/02327 (2013.01); H01L 31/0336 (2013.01); H01L 31/105 (2013.01); H01L 31/109 (2013.01); H01L 31/18 (2013.01); H01L 29/1606 (2013.01)

(58) Field of Classification Search
  CPC .............. H01L 31/0336; H01L 31/105; H01L 31/1075; H01L 31/18
  See application file for complete search history.

(56) References Cited

U.S. PATENT DOCUMENTS

| | | | |
|---|---|---|---|
| 9,806,218 B2* | 10/2017 | Heo | ....................... H01L 31/028 |
| 2008/0308840 A1 | 12/2008 | Ogura | |
| 2012/0145996 A1 | 6/2012 | Ting et al. | |
| 2013/0105795 A1 | 5/2013 | Kim et al. | |
| 2014/0231752 A1 | 8/2014 | Shin et al. | |
| 2014/0231886 A1 | 8/2014 | Shen et al. | |
| 2014/0264275 A1 | 9/2014 | Zhong et al. | |
| 2015/0014630 A1 | 1/2015 | Choi et al. | |
| 2015/0357485 A1 | 12/2015 | Choi et al. | |
| 2016/0343891 A1 | 11/2016 | Heo et al. | |
| 2016/0359062 A1 | 12/2016 | Heo et al. | |

OTHER PUBLICATIONS

Britnell, L. et al. "Strong Light-Matter Interactions in Heterostructures of Atomically Thin Films." *Science*, vol. 340 (Jun. 2013): pp. 1311-1314. Also including "Two Two-Dimensional Materials Are Better than One" by Joachim M. Hamm and Ortwin Hess, pp. 1298-1299, and Supplementary Materials for "Strong Light-Matter Interactions in HeteroStructures of Atomically Thin Films," published May 2, 2013 on *Science Express*.

* cited by examiner

PHOTODETECTOR USING BANDGAP-ENGINEERED 2D MATERIALS AND METHOD OF MANUFACTURING THE SAME

CROSS-REFERENCE TO RELATED APPLICATION

This application is a continuation-in-part of U.S. application Ser. No. 15/085,100, filed Mar. 30, 2016 and issued on Oct. 31, 2017 as U.S. Pat. No. 9,806,218 B2, which claims the benefit under U.S.C. § 119 to Korean Patent Application No. 10-2015-0146663, filed on Oct. 21, 2015, in the Korean Intellectual Property Office, the disclosure of each of which is incorporated herein in its entirety by reference.

BACKGROUND

1. Field

Some example embodiments relate to methods and apparatuses for a photodetector using bandgap-engineered 2-dimensional (2D) materials and a method of manufacturing the same, and more particularly, to a photodetector using bandgap-engineered 2D materials and a method of manufacturing the same.

2. Description of the Related Art

A photodetector has been widely used as a light-receiving device in an optical communication network, a precise measuring system, etc. A recent communication network aims at a $4^{th}$ generation communication network that may operate at terahertz (THz) to process massive data, including a moving image, at a relatively high speed. Therefore, respective parts that are put into a communication network have been reengineered in structures appropriate for processing relatively high-speed massive data.

A graphene is known for effective masses of electrons and holes approximate to 0 at a Dirac point. Therefore, carriers may be theoretically moved at a speed of ⅓₀₀ of light in the graphene, and thus the graphene is known as having a higher mobility than existing known materials. Also, an energy bandgap of the graphene is 0 eV at the Dirac point. Therefore, the graphene may absorb light in most wavelength bands and thus enables a broadband transmission. As a result, massive data may also be transmitted at a relatively high speed by using the graphene. Also, the graphene includes a first layer having a sheet resistance of about 100 ohm/sq and has a light absorption rate of about 2.3%. Therefore, the graphene may be used as a transparent electrode and may be used in a photodetector.

In general, a photodetector using a Transition-Metal Dichalcogenide (TMD) having a relatively high photoelectric sensitivity has been mainly used for photodetection. Because a TMD material has a light absorption rate about 100 times higher than silicon, a photodetector that is thin, but also highly efficient, may be manufactured.

In a photodetector using a graphene and a TMD described above, a TMD material absorbs light, and thus generated electrons and holes can travel to graphene electrodes on both sides. Here, if the TMD material absorbing light directly contacts the graphene electrodes and is not exposed to light, a dark current may flow according to an applied voltage.

SUMMARY

Example embodiments provide methods and apparatuses for a photodetector that inserts a barrier layer having a larger bandgap than a light absorption layer between the light absorption layer absorbing light and an electrode including a graphene to prevent or reduce tunneling of charge carriers before light is incident onto the photodetector so as to prevent or reduce a flow of a dark current, and a method of manufacturing the same.

Additional aspects will be set forth in part in the description which follows and, in part, will be apparent from the description, or may be learned by practice of the presented example embodiments.

According to example embodiments, a photodetector includes an insulating layer on a substrate, a first graphene layer on the insulating layer, a 2-dimensional (2D) material layer on the first graphene layer, a second graphene layer on the 2D material layer, a first electrode on the first graphene layer, and a second electrode on the second graphene layer. The 2D material layer may include a light absorption layer and a barrier layer having a larger bandgap than the light absorption layer.

The light absorption layer may be on the barrier layer.

The barrier layer may be on the light absorption layer.

The light absorption layer may include Transition-Metal Dichalcogenide (TMD).

The barrier layer may include hexagonal boron nitride (h-BN).

The barrier layer may have a thickness less than or equal to about 10 nm.

According to example embodiments, a photodetector includes a first electrode on a substrate, a 2-dimensional (2D) material layer on the first electrode, a first graphene layer on the 2D material layer, and a second electrode on a portion of the first graphene layer. The 2D material layer may include a light absorption layer and a barrier layer having a larger bandgap than the light absorption layer.

The photodetector may further include a second graphene layer between the first electrode and the 2D material layer.

The light absorption layer may be on the barrier layer.

The barrier layer may be on the light absorption layer.

The barrier layer may include h-BN.

The barrier layer may have a thickness less than or equal to about 10 nm.

According to example embodiments, a method of manufacturing a photodetector includes forming an insulating layer on a substrate, forming a first graphene layer on the insulating layer, forming a 2-dimensional (2D) material layer on the first graphene layer, forming a second graphene layer on the 2D material layer, forming a first electrode on the first graphene layer, and forming a second electrode on the second graphene layer. The 2D material layer may include a light absorption layer and a barrier layer having a larger bandgap than the light absorption layer.

The barrier layer may be formed before forming the light absorption layer.

The light absorption layer may be formed before forming the barrier layer.

According to example embodiments, a method of manufacturing a photodetector includes forming a first electrode on a substrate, forming a 2-dimensional (2D) material layer on the first electrode, forming a first graphene layer on the 2D material layer, and forming a second electrode on a portion of the first graphene layer. The 2D material layer may include a light absorption layer and a barrier layer having a larger bandgap than the light absorption layer.

The method may further include forming a second graphene layer between the first electrode and the second electrode.

The barrier layer may be formed before forming the light absorption layer.

The light absorption layer may be formed before forming the barrier layer.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
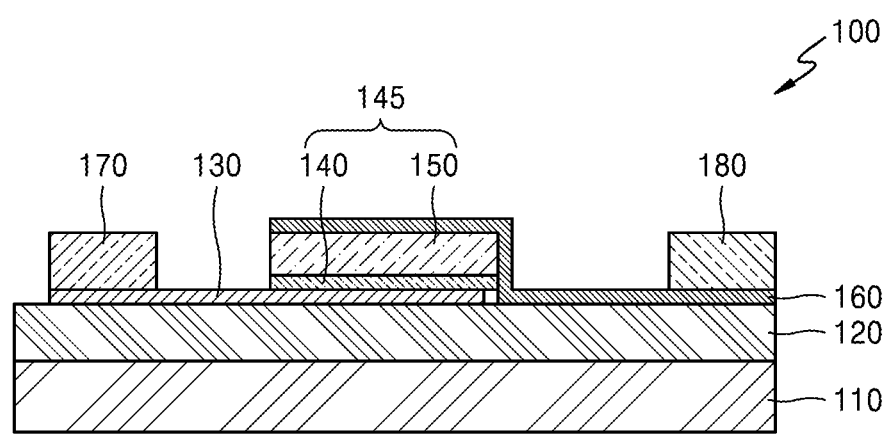
FIG. 1 is a cross-sectional view of a photodetector according to example embodiments.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects.

In the specification, when an element is referred to as being "connected or coupled to" another element, the element may be referred to as being "directly connected or coupled to" or "electrically connected to" another element, or intervening elements may be present. When an element is referred to as "comprising" another element, the other element may be further included but is not excluded as there is no particular contrary description.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a cross-sectional view of a photodetector 100 according to example embodiments.

Referring to FIG. 1, the photodetector 100 includes a substrate 110, an insulating layer 120 formed on the substrate 110, a first graphene layer 130 formed on the insulating layer 120, a 2-dimensional (2D) material layer 145 formed on the first graphene layer 130, a second graphene layer 160 formed on the 2D material layer 145, a first electrode 170 formed on the first graphene layer 130, and a second electrode 180 formed on the second graphene layer 160.

The substrate 110 may be formed of silicon, for example, polysilicon. The substrate 110 may be doped with p-type dopant or n-type dopant and may be used as a gate electrode.

The insulating layer 120 may be formed on the substrate 110. The insulating layer 120 may insulate the substrate 110 and the first graphene layer 130 from each other. The insulating layer 120 may be formed of oxide, nitride, etc., for example, silicon oxide. The insulating layer 120 may also be a gate insulating layer.

The first graphene layer 130 may be formed on the insulating layer 120. The first graphene layer 130 may be formed on only a part of the insulating layer 120. To form the first graphene layer 130, a graphene that is formed by using a micro mechanical exfoliation method, a chemical vapor deposition (CVD) method, an epitaxy synthesis method, an organic synthesis method, etc. may be transferred onto the insulating layer 120 and then patterned. The first graphene layer 130 may also be a path through which holes generated from a light absorption of the light absorption layer 150 transfer.

The 2D material layer 145 may be formed on the first graphene layer 130. The 2D material layer 145 may include a barrier layer 140 and a light absorption layer 150. The barrier layer 140 may be formed on the first graphene layer 130, and then the light absorption layer 150 may be formed. Alternatively, the light absorption layer 150 may be formed on the first graphene layer 130, and then the barrier layer 140 may be formed.

The barrier layer 140 may include an oxide material or a nitride material. The barrier layer 140 may include hexagonal boron nitride (h-BN) and may have a larger bandgap energy than the light absorption layer 150. The barrier layer 140 that has the larger bandgap energy than the light absorption layer 150 may prevent or reduce a flow of a dark current that may be generated even if there is no light.

The light absorption layer 150 may include a Transition-Metal Dichalcogenide (TMD) material and may absorb light incident from an outside. The TMD material may include one transition metal selected from molybdenum (Mo), tungsten (W), niobium (Nb), vanadium (V), tantalum (Ta), titanium (Ti), zirconium (Zr), hafnium (Hf), technetium (Tc), and rhenium (Re) and one chalcogen element selected from sulfur (S), selenium (Se), and tellurium (Te). For example, the TMD material may be expressed as $MX_2$, wherein M denotes a transition metal, and X is the chalcogen element. The transition metal M may be Mo, W, Nb, V, Ta, Ti, Zr, Hf, Tc, Re, etc., and the chalcogen element X may be S, Se, Te, etc. For example, the TMD material may be molybdenum disulfide ($MoS_2$), molybdenum diselenide ($MoSe_2$), molybdenum ditellurium ($MoTe_2$), tungsten sulfide ($WS_2$), tungsten diselenide ($WSe_2$), tungsten ditellurium ($WTe_2$), zirconium sulfide ($ZrS_2$), zirconium disulfide ($ZrSe_2$), hafnium disulfide ($HfS_2$), hafnium diselenide ($HfSe_2$), niobium diselenide ($NbSe_2$), rhenium diselenide ($ReSe_2$), etc.

Alternatively, the TMD material may not be expressed as $MX_2$. For example, a compound of a transition metal Cu and chalcogen element S may be expressed as CuS. The compound CuS may also be a 2D material and thus may be applied as the TMD material. Also, the light absorption layer 150 may be a chalcogenide material including a non-transition metal. For example, the non-transition metal may be gallium (Ga), indium (In), tin (Sn), germanium (Ge), lead (Pb), etc. In other words, a compound of a non-transition metal, e.g., Ga, In, Sn, Ge, Pb, etc. and a chalcogen element, e.g., S, Se, or Te, may be used as a material of the light absorption layer 150. For example, the chalcogenide material including the non-transition metal tin diselenide ($SnSe_2$), gallium sulfur (GaS), gallium selenium (GaSe), gallium tellurium (GaTe), germanium selenium (GeSe), indium triselenide ($In_2Se_3$), indium tin sulfide ($InSnS_2$), etc. Therefore, the light absorption layer 150 may include one metal element selected from Mo, W, Nb, V, Ta, Ti, Zr, Hf, Tc, Re, Cu, Ga, In, Sn, Ge and Pb, and one chalcogen element selected from S, Se, and Te. However, materials (elements) provided herein are example, and other types of materials (elements) may be applied.

Electrons and holes may be generated in the light absorption layer 150 due to a light absorption, and a light current may be generated according to transfers of the electrons and the holes. For example, the holes that are generated by the light absorption of the light absorption layer 150 may transfer to a first electrode 170 along the first graphene layer 130, and the electrons may transfer to a second electrode 180 along the second graphene layer 160. Alternatively, the electrons may transfer to the first electrode 170 along the first graphene layer 130, and the holes may transfer to the second electrode 180 along the second graphene layer 160.

The barrier layer 140 exists between the light absorption layer 150 and the first graphene layer 130 or between the light absorption layer 150 and the second graphene layer 160. However, because the electrons generated by the light absorption have energy exceeding a bandgap of the barrier layer 140, the electrons and the holes may flow through the barrier layer 140.

The barrier layer 140 may also be formed to a thickness thinner than or equal to about 10 nm. If the barrier layer 140 is formed to the thickness thinner than or equal to about 10 nm, a transit time at which the electrons and the holes transfer to the first and second graphene layers 130 and 160 may be shorter than a recombination time at which the electrons and the holes are recombined. Therefore, the electrons and the holes generated by the light absorption of the light absorption layer 150 may transfer to the first and second graphene layers 130 and 160, and thus a light current may be generated.

The second graphene layer 160 may be formed on the 2D material layer 145. The second graphene layer 160 may extend from the 2D material layer 145 to be formed even on the insulating layer 120. To form the second graphene layer 160, a graphene may transfer onto the 2D material layer 145 and the insulating layer 120 and then patterned. Here, the graphene is formed by using a micro mechanical exfoliation, a CVD method, an epitaxy synthesis method, an organic synthesis method, etc. Also, the second graphene layer 160 may be a path through which the electrons generated by the light absorption of the light absorption layer 150 transfer.

The second electrode 180 may be formed on a part of the second graphene layer 160, and the first electrode 170 may be formed on a part of the first graphene layer 130. The second electrode 180 and the first electrode 170 may be formed of palladium (Pd), titanium (Ti), or an alloy thereof. One of the first and second electrodes 170 and 180 may be a source electrode, and the other one of the first and second electrodes 170 and 180 may be a drain electrode.

The electrons generated by the light absorption of the light absorption layer 150 may transfer to the second electrode 180 along the second graphene layer 160, and the holes may transfer to the first electrode 170 along the first graphene layer 130. Alternatively, the holes may transfer to the second electrode 180 along the second graphene layer 160, and the electrons may transfer to the first electrode 170 along the first graphene layer 130.

Figure 2A:
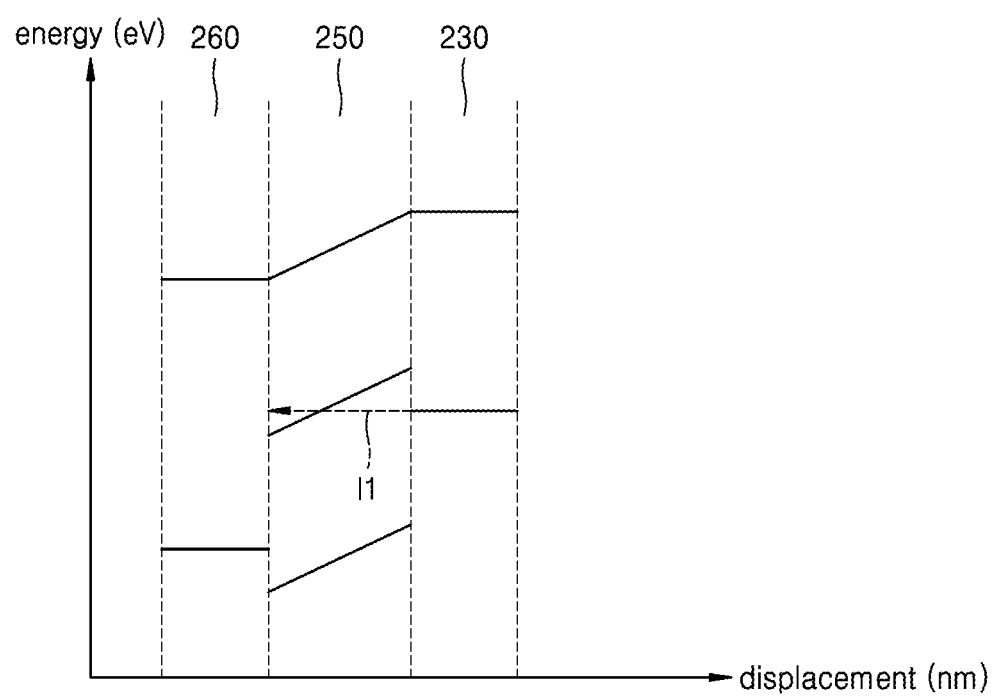
FIG. 2A is a graph schematically illustrating energy levels of a first graphene layer, a light absorption layer, and a second graphene layer in an existing photodetector not including a barrier layer.

FIG. 2A is a graph schematically illustrating energy levels of a first graphene layer 230, a light absorption layer 250, and a second graphene layer 260 in an existing photodetector not including a barrier layer.

Referring to FIG. 2A, the first graphene layer 230 may have a higher potential than the second graphene layer 260 through an application of a built-in potential or a voltage in an equilibrium state. Here, even before light is irradiated onto the light absorption layer 250, a dark current 11 may flow from the first graphene layer 230 to the second graphene layer 260 through the light absorption layer 250. Even before light is incident onto the light absorption layer 250, a flow of a current may occur. Therefore, a detectivity of the photodetector may be reduced.

Figure 2B:
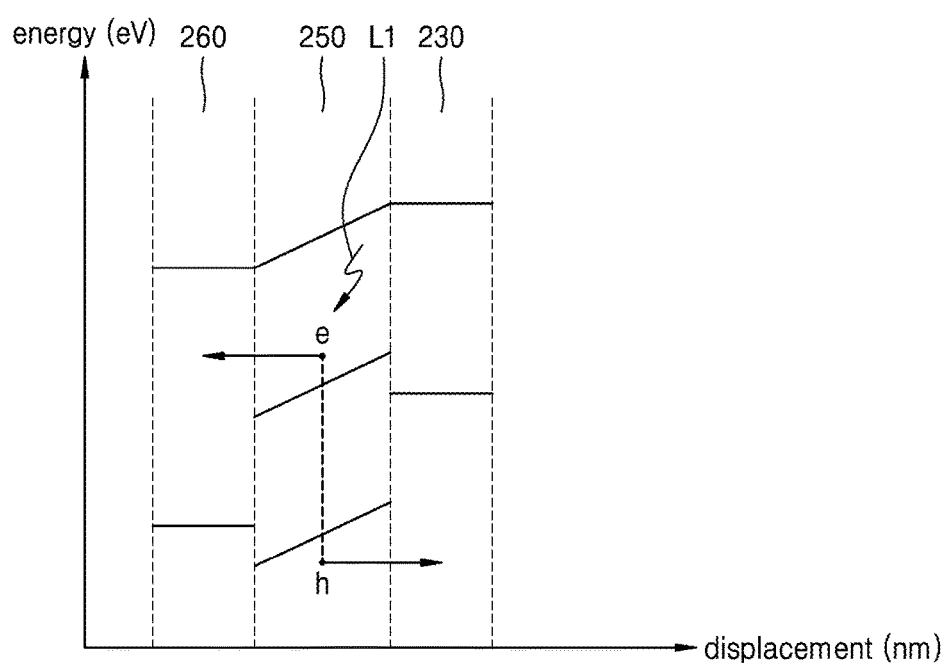
FIG. 2B is a graph schematically illustrating transfers of electrons and holes when light is irradiated onto the light absorption layer in the existing photodetector not including the barrier layer.

FIG. 2B is a graph schematically illustrating transfers of electrons e and holes h when light L1 is irradiated onto the light absorption layer 250 in the existing photodetector not including the barrier layer.

Referring to FIG. 2B, the light incident onto the light absorption layer 250 excites electrons existing in a valance band to a conduction band so as to generate the electrons e and the holes h. The generated electrons e may transfer to the second graphene layer 260, and the holes h may transfer to the first graphene layer 230 so as to generate a light current. Also, the light incident onto the light absorption layer 250 may penetrate through the first graphene layer 230 or the second graphene layer 260 to be incident onto the light absorption layer 250.

Figure 2C:
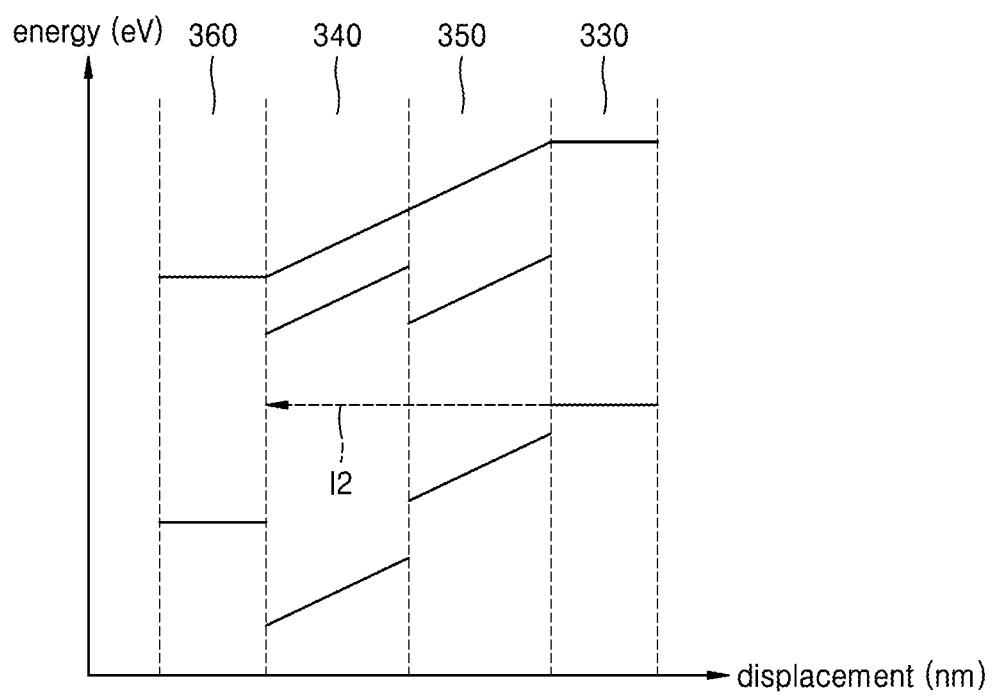
FIG. 2C is a graph schematically illustrating energy levels of a first graphene layer, a light absorption layer, a barrier layer, and a second graphene layer in a photodetector according to example embodiments.

FIG. 2C is a graph schematically illustrating energy levels of a first graphene layer 330, a light absorption layer 350, a barrier layer 340, and a second graphene layer 360 in a photodetector according to example embodiments.

Referring to FIG. 2C, the first graphene layer 330 may have a higher potential than the second graphene layer 360 through an application of a built-in potential or a voltage in an equilibrium state. Also, the barrier layer 340 has larger bandgap energy than the light absorption layer 350. Before light is irradiated onto the light absorption layer 350, a dark current 12 may be generated due to a potential difference between the first graphene layer 330 and the second graphene layer 360. However, the barrier layer 340 having the larger bandgap energy than the light absorption layer 350 may reduce a tunneling probability of the dark current 12 so as to prevent or reduce the dark current 12 from flowing from the first graphene layer 330 to the second graphene layer 360. The photodetector according to example embodiments may have a relatively high detectivity due to the reduction in the dark current 12 and may operate even at a relatively low illuminance.

Figure 2D:
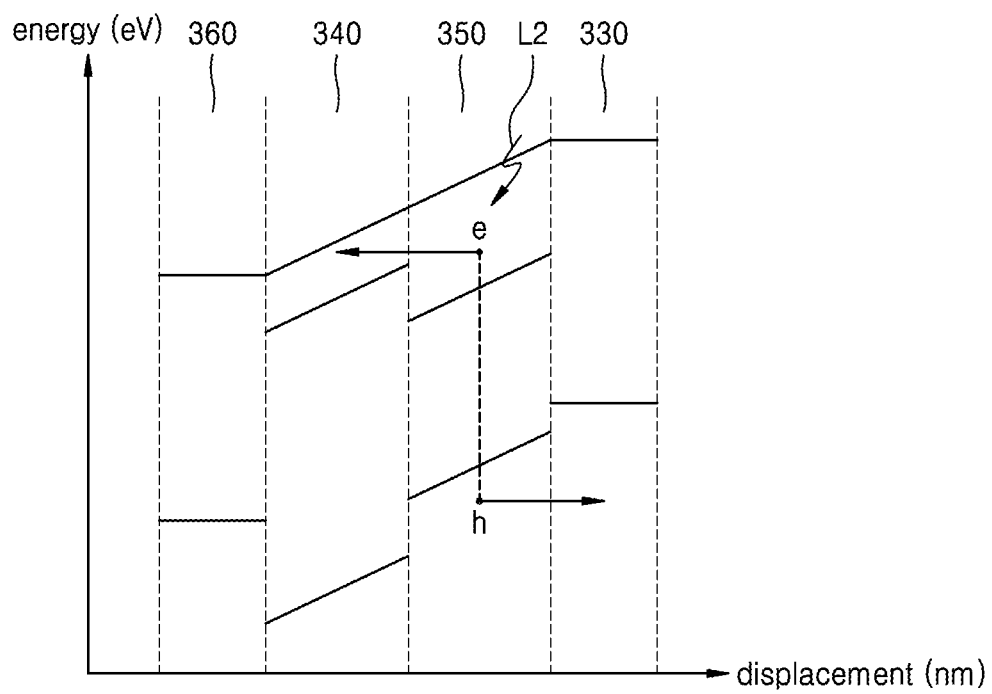
FIG. 2D is a graph schematically illustrating transfers of electrons and holes when light is irradiated onto the light absorption layer in the photodetector according to example embodiments.

FIG. 2D is a graph schematically illustrating transfers of electrons e and holes h when light L2 is irradiated onto the light absorption layer 350 in the photodetector according to example embodiments.

Referring to FIG. 2D, the light L2 incident onto the light absorption layer 350 may excite electrons existing in a valance band to a conduction band so as to generate the electrons e and the holes h. The generated electrons e may transfer to the second graphene layer 360, and the holes h may transfer to the first graphene layer 330 so as to generate a light current. Also, the light L2 incident onto the light absorption layer 350 may penetrate through the first graphene layer 330 or the second graphene layer 360 to be incident onto the light absorption layer 350.

FIGS. 3A through 3D are cross-sectional views illustrating a method of manufacturing the photodetector 100, according to example embodiments.

Figure 3A:
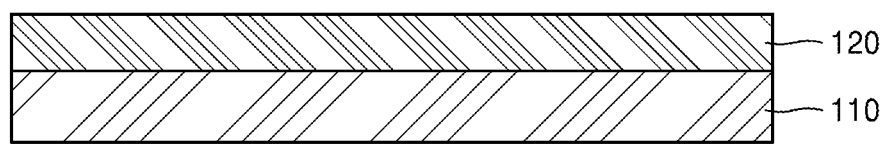
FIGS. 3A through 3E are cross-sectional views illustrating a method of manufacturing a photodetector according to example embodiments.

Referring to FIG. 3A, the substrate 110 is provided, and the insulating layer 120 is formed on the substrate 110. For example, the substrate 110 may be formed of silicon, in more detail, may be formed of polysilicon. The substrate 110 may also be doped with p-type dopant or n-type dopant. The insulating layer 120 may be formed of oxide or nitride, for example, silicon oxide.

Figure 3B:
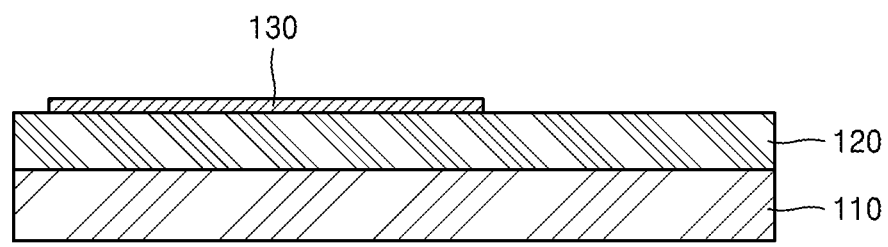

Referring to FIG. 3B, the first graphene layer 130 is formed on the insulating layer 120. The first graphene layer 130 may be formed only on a part of the insulating layer 120. Various processes, e.g., a CVD method, a thermal CVD (TCVD) method, a rapid TCVD (RTCVD) method, a plasma enhanced CVD (PECVD) method, an inductive coupled plasma chemical vapor deposition (ICP-CVD) method, an atomic layer deposition (ATLD) method, etc., may be used in a process of forming the first graphene layer 130. A carbon supply source of a vapor may be one or more selected from a group consisting of carbon elements, e.g., methane ($CH_4$), carbon monoxide (CO), ethane ($C_2H_6$), ethylene ($CH_2$), ethanol ($C_2H_5$), acetylene ($C_2H_2$), propane ($CH_3CH_2CH_3$), propylene ($C_3H_6$), butane ($C_4H_{10}$), pentane ($CH_3(CH_2)_3CH_3$), pentene ($C_5H_{10}$), cyclopentadiene ($C_5H_6$), hexane ($C_6H_{14}$), cyclohexane ($C_6H_{12}$), benzene ($C_6H_6$), toluene ($C_7H_8$), etc.

Also, a doping process may be performed on the first graphene layer 130. The doping process may be performed by using a dry or wet doping method. The doping process enables a sheet resistance to decrease without a decrease in a transmittancy of the first graphene layer 130. Therefore, an optical characteristic (transmittancy) of the first graphene layer 130 may be secured, and an electrical characteristic (sheet resistance) may be improved.

To form the first graphene layer 130, a graphene that is formed according to a method as described above may be transferred onto the insulating layer 120 and then patterned. Also, the first graphene layer 130 may be a path through which holes generated from a light absorption of the light absorption layer 150 transfer.

Figure 3C:
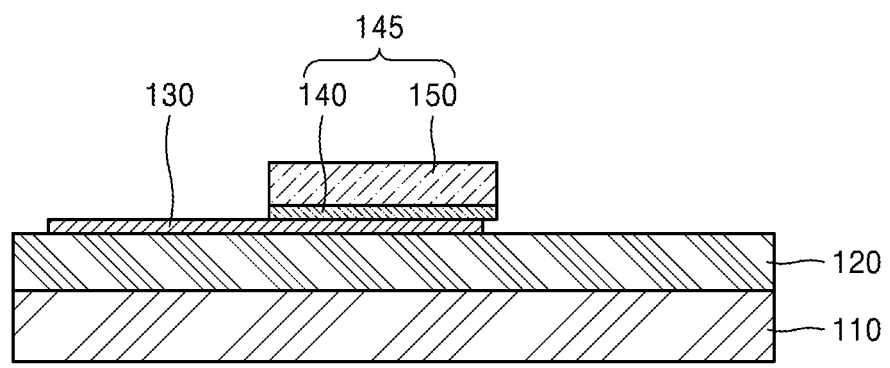

Referring to FIG. 3C, the 2D material layer 145 is formed on the first graphene layer 130. The 2D material layer 145 may be formed on a part of the first graphene layer 130. After the 2D material layer 145 is formed on the first graphene layer, the 2D material layer 145 may be patterned by patterning process.

The 2D material layer 145 may include the barrier layer 140 and the light absorption layer 150. The barrier layer 140 may be formed on the first graphene layer 130, and then the light absorption layer 150 may be formed. Alternatively, the light absorption layer 150 may be formed on the first graphene layer 130, and then the barrier layer 140 may be formed.

Also, the barrier layer 140 may be formed to a thickness thinner than or equal to about 10 nm. If the barrier layer 140 is formed to the thickness thinner than or equal to about 10 nm, a transit time at which the electrons and the holes transfer to the first and second graphene layers 130 and 160 may be shorter than a recombination time at which the electrons and the holes are recombined. Therefore, the electrons and the holes generated by the light absorption of the light absorption layer 150 may transfer to the first and second graphene layers 130 and 160, and thus a light current may be generated.

Figure 3D:
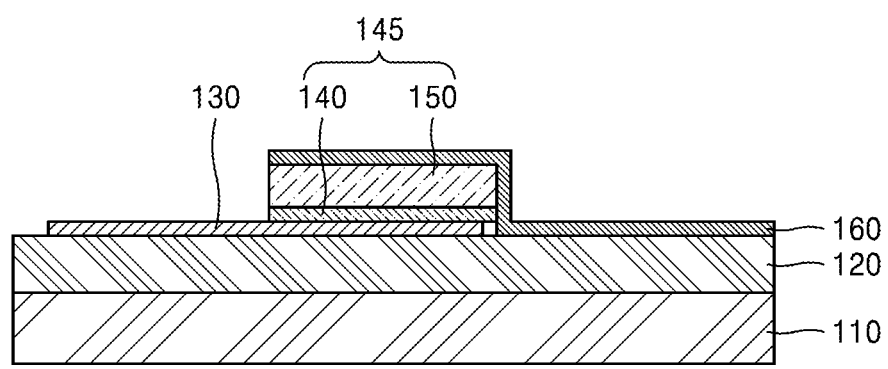

Referring to FIG. 3D, the second graphene layer 160 is formed on the 2D material layer 145. The second graphene layer 160 may extend from the 2D material layer 145 to be formed on the insulating layer 120. The second graphene layer 160 may be formed through the same process as that through which the first graphene layer 130 is formed. Also, a doping process may be performed on the second graphene layer 160. The doping process may be performed by using a dry or wet doping method. The doping process enables a reduction in a sheet resistance without a decrease in a transmittancy of the second graphene layer 160. Therefore, an optical characteristic (transmittancy) of the second graphene layer 160 may be secured, and an electrical characteristic (sheet resistance) may be improved.

To form the second graphene layer 160, a graphene formed using a method as described above may be transferred onto the 2D material layer 145 and the insulating layer 120 and then patterned. Also, the second graphene layer 160 may be a path through which the electrons generated from the light absorption of the light absorption layer 150 transfer.

Figure 3E:
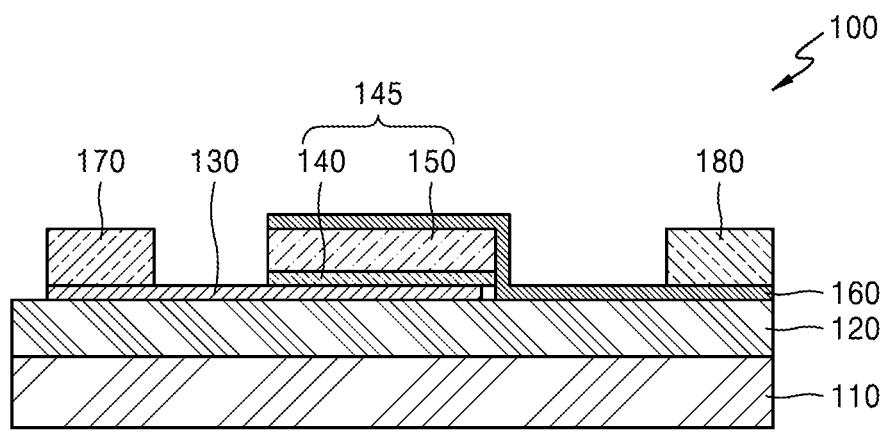

Referring to FIG. 3E, the second electrode 180 is formed on a part of the second graphene layer 160, and the first electrode 170 is formed on a part of the first graphene layer 130. The second electrode 180 and the first electrode 170 may, for example, be formed of Pd, Ti, or an alloy thereof.

Figure 4:
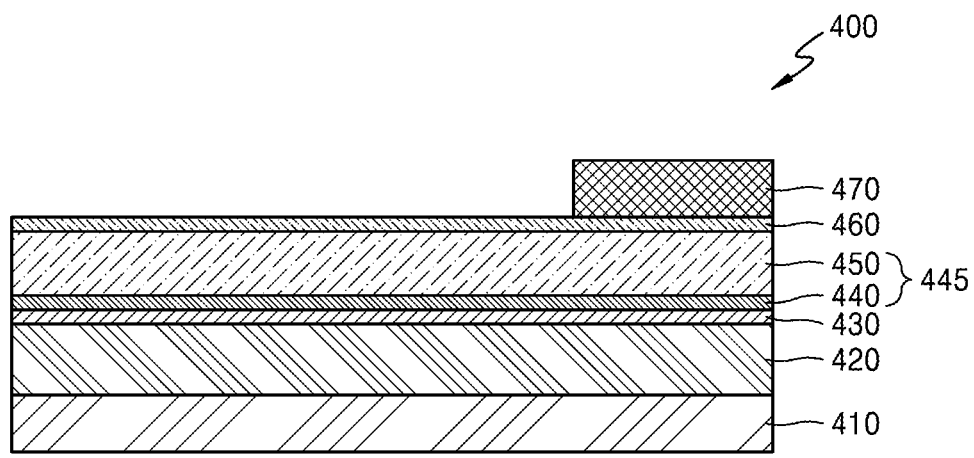
FIG. 4 is a cross-sectional view of a photodetector according to example embodiments.

FIG. 4 is a cross-sectional view of a photodetector 400 according to example embodiments.

Referring to FIG. 4, the photodetector 400 includes a substrate 410, a first electrode 420 formed on the substrate 410, a first graphene layer 430 formed on the first electrode 420, a 2D material layer 445 formed on the first graphene layer 430, a second graphene layer 460 formed on the 2D material layer 445, and a second electrode 470 formed on the second graphene layer 460.

The substrate 410 may, for example, be formed of silicon, for example, polysilicon. The substrate 410 may also be doped with p-type dopant or n-type dopant and may be used as a gate electrode.

The first electrode 420 may be formed on the substrate 410. The first electrode 420 may be a source electrode or a drain electrode. The first electrode 420 may, for example, be formed of Pd, Ti, or an alloy thereof. Electrons or holes generated by a light absorption of the light absorption layer 450 may transfer to the first electrode 420 along the first graphene layer 430.

The first graphene layer 430 may be formed on the first electrode 420. To form the first graphene layer 430, a graphene that is formed by using a micro mechanical exfoliation method, a CVD method, an epitaxy synthesis method, an organic synthesis method, etc. may be transferred onto the first electrode 420. Also, the first graphene layer 430 may be a path through which the electrons or holes generated from the light absorption of the light absorption layer 450 transfer.

The first graphene layer 430 may not be formed on the first electrode 420. Although the 2D material layer 445 is directly formed on the first electrode 420 without the first graphene layer 430, whole surfaces of the first electrode 420 and the 2D material layer 445 may be electrically connected to each other, and thus photoelectric separation efficiency may be maintained.

The 2D material layer 445 may be formed on the first graphene layer 430. If the first graphene layer 430 is not formed, the 2D material layer 445 may be directly formed on the first electrode 420. The 2D material layer 445 may include a barrier layer 440 and a light absorption layer 450. The barrier layer 440 may be first formed, and then the light absorption layer 450 may be formed. Alternatively, the light absorption layer 450 may be first formed, and then the barrier layer 440 may be formed.

The barrier layer 440 may include an oxide material or a nitride material. The barrier layer 440 may include h-BN and may have a larger bandgap energy than the light absorption layer 450. The barrier layer 440 having the larger bandgap energy than the light absorption layer 450 may prevent or reduce a flow of a dark current that may be generated even if there is no light.

The light absorption layer 450 may include a TMD material and may absorb light incident from the external environment. The TMD material may include one transition metal selected from Mo, W, Nb, V, Ta, Ti, Zr, Hf, Tc, and Re and one chalcogen element selected from S, Se, and Te. The TMD material may, for example, be expressed as $MX_2$, wherein M denotes a transition metal, and X denotes a chalcogen element. The transition metal M may be Mo, W, Nb, V, Ta, Ti, Zr, Hf, Tc, Re, etc., and the chalcogen element X may be S, Se, or Te. The TMD material may, for example, be $MoS_2$, $MoSe_2$, $MoTe_2$, $WS_2$, $WSe_2$, $WTe_2$, $ZrS_2$, $ZrSe_2$, $HfS_2$, $HfSe_2$, $ReSe_2$, etc.

Alternatively, the TMD material may not be expressed as $MX_2$. For example, a compound of transition metal Cu and chalcogen element S may be expressed as CuS. The compound CuS may be a 2D material and thus may be applied as a TMD material. Also, the light absorption layer 450 may be a chalcogenide material including a non-transition metal. The non-transition metal may be, for example, Ga, In, Sn, Ge, Pb, etc. In other words, a compound of a non-transition metal, e.g., Ga, In, Sn, Ge, Pb, etc., and a chalcogen element, e.g., S, Se, or Te, may be used as a material of the light absorption layer 450.

The chalcogenide material including the non-transition metal may, for example, be $SnSe_2$, GaS, GaSe, GaTe, GeSe, $In_2Se_3$, $InSnS_2$, etc. Therefore, the light absorption layer 450 may include one metal element selected from Mo, W, Nb, V, Ta, Ti, Zr, Hf, Tc, Re, Cu, Ga, In, Sn, Ge, and Pb and one chalcogen element selected from S, Se, and Te. However, materials (elements) provided herein are examples, and other types of materials (elements) may be applied.

Electrons and holes may be generated in the light absorption layer 450 due to light absorption, and a light current may be generated according to transfers of the electrons and the holes. For example, the holes generated by the light absorption of the light absorption layer 450 may transfer to the first electrode 420 along the first graphene layer 430, and the electrons may transfer to the second electrode 470 along the second graphene layer 460.

The barrier layer 440 may exist between the light absorption layer 450 and the first graphene layer 430 or between the light absorption layer 450 and the second graphene layer 460. However, because the electrons generated by the light absorption have energy exceeding a bandgap of the barrier layer 440, the electrons and the holes may flow through the barrier layer 440.

Also, the barrier layer 440 may be formed to a thickness thinner than or equal to about 10 nm. If the barrier layer 440 is formed to the thickness thinner than or equal to about 10 nm, a transit time at which the electrons and the holes transfer to the first and second graphene layers 430 and 460 may be shorter than a recombination time at which the electrons and the holes are recombined. Therefore, the electrons and the holes generated by the light absorption of the light absorption layer 450 may transfer to the first and second graphene layers 430 and 460, and thus a light current may be generated.

The second graphene layer 460 may be formed on the 2D material layer 445. To form the second graphene layer 460, a graphene that is formed by using a micro mechanical exfoliation method, a CVD method, an epitaxy synthesis method, an organic synthesis method, etc. may be transferred onto the 2D material layer 445. Also, the second graphene layer 460 may be a path through which the electrons or the holes generated by the light absorption of the light absorption layer 450 transfer.

The second electrode 470 may be formed on the second graphene layer 460. The second electrode 470 may be a source electrode or a drain electrode. The second electrode 470 may, for example, be formed of Pd, Ti, or an alloy of them. The second electrode 470 may be formed only on a part of the second graphene layer 460. Light incident onto the photodetector 400 may penetrate from the second graphene layer 460 through a part, on which the second electrode 470 is not formed, to be incident onto the light absorption layer 450.

The electrons and the holes generated by the light absorption of the light absorption layer 450 may transfer to the first electrode 420 and the second electrode 470 along the first graphene layer 430 and the second graphene layer 460.

FIGS. 5A through 5D are cross-sectional views illustrating a method of manufacturing the photodetector 400, according to example embodiments.

Figure 5A:
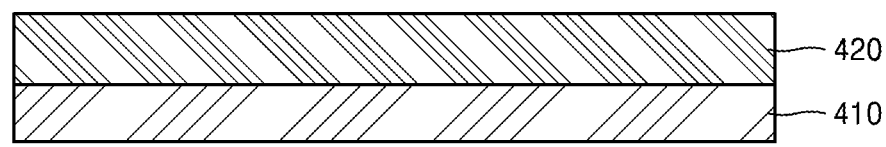
FIGS. 5A through 5D are cross-sectional views illustrating a method of manufacturing a photodetector according to example embodiments.

Referring to FIG. 5A, the substrate 410 is provided, and then the first electrode 420 is formed on the substrate 410. The substrate 410 may, for example, be formed of silicon, e.g., polysilicon. The substrate 410 may also be doped with p-type dopant or n-type dopant. The first electrode 420 may, for example, be formed of Pd, Ti, or an alloy thereof.

Figure 5B:
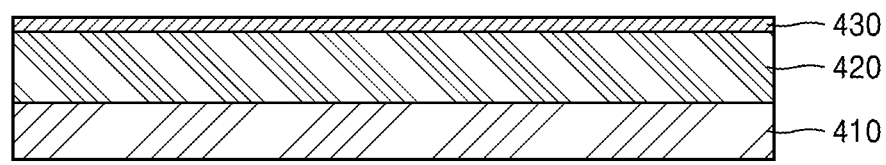

Referring to FIG. 5B, the first graphene layer 430 is formed on the first electrode 420. Various processes, e.g., a CVD method, a TCVD method, a RTCVD method, a PECVD method, an ICP-CVD method, an ATLD method, etc., may be used in a process of forming the first graphene layer 430. One or more selected from a group consisting of carbon elements, e.g., $CH_4$, $CO$, $C_2H_6$, $CH_2$, $C_2H_5$, $C_2H_2$, $CH_3CH_2CH_3$, $C_3H_6$, $C_4H_{10}$, $CH_3(CH_2)_3CH_3$, $C_5H_{10}$, $C_5H_6$, $C_6H_{14}$, $C_6H_{12}$, $C_6H_6$, and $C_7H_8$, may be used as a carbon supply source of vapor.

Also, a doping process may be performed on the first graphene layer 430. The doping process may be performed by using a dry or wet doping method. The doping process enables a reduction in a sheet resistance without a decrease in transmittancy of the first graphene layer 430. Therefore, an optical characteristic (transmittancy) of the first graphene layer 430 may be secured, and an electric characteristic (sheet) resistance may be improved.

A graphene that is formed using a method as described above may be transferred onto the first electrode 420 to form the first graphene layer 430. Also, the first graphene layer 430 may be a path through which electrons or holes generated from a light absorption of the light absorption layer 450 transfer.

A process of forming the first graphene layer 430 may be omitted. Although the 2D material layer 445 is directly formed on the first electrode 420 without the first graphene layer 430, whole surfaces of the first electrode 420 and the 2D material layer 445 may be electrically connected to each other, and thus photoelectric separation efficiency may be maintained.

Figure 5C:
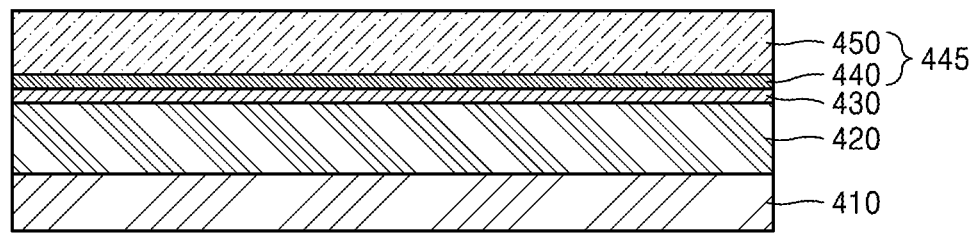

Referring to FIG. 5C, the 2D material layer 445 is formed on the first graphene layer 430. The 2D material layer 445 may include the barrier layer 440 and the light absorption layer 450. In the process of forming the 2D material layer 445, the barrier layer 440 may be formed on the first graphene layer 430, and then the light absorption layer 450 may be formed or the light absorption layer 450 may be formed on the first graphene layer 430, and then the barrier layer 440 may be formed.

Also, the barrier layer 440 may be formed to a thickness thinner than or equal to about 10 nm. If the barrier layer 440 is formed to the thickness thinner than or equal to about 10 nm, a transit time at which the electrons and the holes transfer to the first and second graphene layers 430 and 460 may be shorter than a recombination time at which the electrons and the holes are recombined. Therefore, the electrons and the holes generated by the light absorption of the light absorption layer 450 may transfer to the first and second graphene layers 430 and 460, and thus a light current may be generated.

Figure 5D:
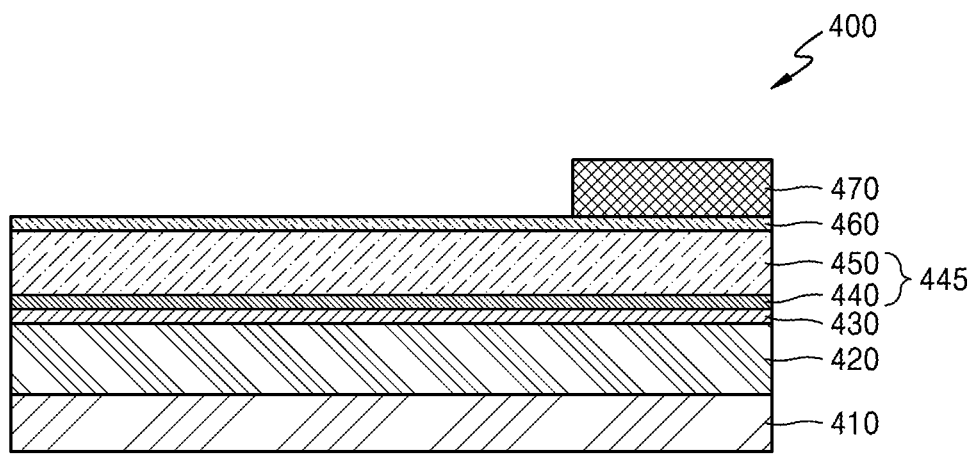

Referring to FIG. 5D, the second graphene layer 460 is formed on the 2D material layer 445, and the second electrode 470 is formed on the second graphene layer 460. The second graphene layer 460 may be formed through the same process as that through which the first graphene layer 430 is formed. The second electrode 470 may, for example, be formed of Pd, Ti, or an alloy thereof. The second electrode 470 is also formed on a part of the second graphene layer 460. Light incident onto the photodetector 400 may penetrate from the second graphene layer 460 through a part, on which the second electrode 470 is not formed, to be incident onto the light absorption layer 450.

The electrons and the holes generated by the light absorption of the light absorption layer 450 may transfer to the first electrode 420 and the second electrode 470 along the first graphene layer 430 and the second graphene layer 460.

A photodetector according to example embodiments includes a light absorption layer absorbing light and a barrier layer having a larger bandgap than the light absorption layer between electrodes including a graphene. Although light is not irradiated, a dark current may be generated according to an applied voltage. The barrier layer may reduce a tunneling probability of the dark current.

Also, the photodetector including the barrier layer may have a relatively high detectivity due to the reduction in the dark current and may operate even at a relatively low illuminance.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A photodetector comprising:
   an insulating layer on a substrate;
   a first layer on the insulating layer;
   a barrier layer on the first layer;
   a light absorption layer on the barrier layer, the light absorption layer having a smaller bandgap than the barrier layer; and
   a second layer on the light absorption layer,
   wherein at least one of the first layer or the second layer includes a graphene layer.

2. The photodetector of claim 1, wherein the light absorption layer includes Transition-Metal Dichalcogenide (TMD).

3. The photodetector of claim 1, wherein the light absorption layer includes at least one of $SnSe_2$, GaS, GaSe, GaTe, GeSe, $In_2Se_3$ and $InSnS_2$.

4. The photodetector of claim 1, wherein the barrier layer includes hexagonal boron nitride (h-BN).

5. The photodetector of claim 1, wherein the barrier layer includes an oxide material or a nitride material.

6. The photodetector of claim 1, wherein the barrier layer has a thickness less than or equal to about 10 nm.

7. A photodetector comprising:
- a first electrode on a substrate;
- a barrier layer on the first electrode;
- a light absorption layer on the barrier layer, the light absorption layer having a smaller bandgap than the barrier layer;
- a first layer on the light absorption layer; and
- a second electrode on a portion of the first layer.

8. The photodetector of claim 7, further comprising:
- a second layer between the first electrode and the barrier layer,
- wherein at least one of the first layer or the second layer includes a graphene layer.

9. The photodetector of claim 7, wherein the light absorption layer includes Transition-Metal Dichalcogenide (TMD).

10. The photodetector of claim 7, wherein the light absorption layer includes at least one of $SnSe_2$, GaS, GaSe, GaTe, GeSe, $In_2Se_3$ and $InSnS_2$.

11. The photodetector of claim 7, wherein the barrier layer includes hexagonal boron nitride (h-BN).

12. The photodetector of claim 7, wherein the barrier layer includes an oxide material or a nitride material.

13. The photodetector of claim 7, wherein the barrier layer has a thickness less than or equal to about 10 nm.

14. A method of manufacturing a photodetector, the method comprising:
- forming an insulating layer on a substrate;
- forming a first layer on the insulating layer;
- forming a barrier layer on the first layer;
- forming a light absorption layer on the barrier layer, the light absorption layer having a smaller bandgap than the barrier layer; and
- forming a second layer on the light absorption layer,
- wherein at least one of the first layer or the second layer includes a graphene layer.

15. A method of manufacturing a photodetector, the method comprising:
- forming a first electrode on a substrate;
- forming a barrier layer on the first electrode;
- forming a light absorption layer on the barrier layer, the light absorption layer having a smaller bandgap than the barrier layer;
- forming a first layer on the light absorption layer; and
- forming a second electrode on a portion of the first layer.

16. The method of claim 15, further comprising:
- forming a second layer between the first electrode and the barrier layer,
- wherein at least one of the first layer or the second layer includes a graphene layer.

* * * * *